United States Patent [19]

Straw

[11] Patent Number: 5,339,285
[45] Date of Patent: Aug. 16, 1994

[54] MONOLITHIC LOW NOISE PREAMPLIFIER FOR PIEZOELECTRIC SENSORS

[75] Inventor: Timothy B. Straw, New London, Conn.

[73] Assignee: The United States of America as represented by the Secretary of the Navy, Washington, D.C.

[21] Appl. No.: 45,143

[22] Filed: Apr. 12, 1993

[51] Int. Cl.⁵ .............................. H04B 1/06; H03F 3/45
[52] U.S. Cl. ...................................... 367/135; 330/258
[58] Field of Search .................. 367/135, 63; 330/258, 330/260, 294

[56] References Cited

U.S. PATENT DOCUMENTS

| | | | |
|---|---|---|---|
| 4,667,165 | 5/1987 | De Weck | 330/253 |
| 4,689,578 | 8/1987 | Spychalski | 330/260 |
| 4,906,943 | 3/1990 | Koch | 330/258 |
| 5,084,639 | 1/1992 | Ribner | 330/9 |

Primary Examiner—Ian J. Lobo
Attorney, Agent, or Firm—Michael J. McGowan; Prithvi C. Lall; Michael F. Oglo

[57] ABSTRACT

A preamplifier for a piezoelectric sensor requiring a high-impedance, low noise interface circuit. The preamplifier is a single, monolithic integrated circuit that can be mounted directly onto or inside a miniature sensor without degrading the sensor's performance. The preamplifier performs signal amplification with a full-differential amplifier that includes common-mode feedback. A pair of feedback capacitors together with the sensor capacitance control the voltage gain of the preamplifier over much of it's useful operating range of 100 Hz to 100 kHz. The preamplifier circuit also has feedback resistors that discharge any accumulated DC voltage which might appear on the capacitors. Also the feedback resistors form a high pass filter which rejects low .frequency background noise from the sensor.

6 Claims, 2 Drawing Sheets

MONOLITHIC LOW NOISE PREAMPLIFIER FOR PIEZOELECTRIC SENSORS

STATEMENT OF GOVERNMENT INTEREST

The invention described herein may be manufactured and used by or for the Government of the United States of America for governmental purposes without the payment of any royalties thereon or therefor.

BACKGROUND OF THE INVENTION (1) Field of the Invention

The present invention relates to the detection and amplification of a low level signal from a piezoelectric sensor. It is intended that this preamplifier provide the gain, frequency response shaping, impedance matching, static charge dissipation, and low noise floor necessary in order that this device serve as the sole component between a piezoelectric sensor and any follow-on circuitry such as an analog-to-digital converter. It is further intended that this invention be suitable for incorporation on the same monolithic integrated circuit as the follow-on circuitry.

This device can be used wherever a piezoelectric sensor requires a high-impedance, low noise interface circuit. The applications for the preamplifier include sonar hydrophones, piezoelectric accelerometers, pressure sensors, and any other piezoelectric sensor which has very small capacitance and thus high impedance. The preamplifier can be incorporated onto a monolithic integrated circuit with an analog-to-digital data interface function, thus achieving a lower total noise than could be obtained by direct connection of the sensor to an analog-to-digital converter. This device can be mounted directly onto or inside a miniature sensor without degrading the sensor's performance.

(2) Description of the Prior Art

A piezoelectric sensor can be thought of as a voltage source in series with a capacitor. In certain applications it is necessary that this sensor be very small. Two such examples are, high frequency beamformed acoustic arrays which require very small, omni-directional acoustic sensors and miniature accelerometers which require small mass. Typical existing preamplifiers are built from discrete electrical components and are frequently larger and more massive than the sensor itself. This results in a degradation of the sensor performance due to signal interaction (i.e. scattering, reflection, loading, etc.) if the preamplifier is located close to the sensor. A sensor connected to a preamplifier that has discrete electrical components is shown in U.S. Pat. No. 4,013,992, Diver's Piezoelectric Microphone with Integral AGC Preamplifier, Larry F. Dewberry et al., inventors. One remedy is to relocate the preamplifier a significant distance from the sensor. A problem with preamplifier relocation arises due to interconnecting cable capacitance which attenuates the sensor signal and thus reduces the sensor signal-to-preamplifier noise ratio. Thus, previously available preamplifiers limit the performance that can be achieved from small sensors.

SUMMARY OF THE INVENTION

Accordingly, it is a general purpose and object of the present invention to provide an improved preamplifier. It is a further object that the preamplifier be constructed in a single monolithic integrated circuit in small size without the need for any external components. It is another object that the preamplifier have low noise when used with sensors having capacitive impedance. Further objects are that the preamplifier uses low power and has wide bandwidth, and is suitable for adjustable gain and corner frequency. In addition the solid state nature of monolithic integrated circuit technology makes the preamplifier insensitive to hydrostatic pressure. The full-differential configuration makes this preamplifier insensitive to silicon substrate noise and thus will allow the incorporation of this device onto the same IC as an analog-to-digital converter that may have substrate noise.

These objects are accomplished with the present invention by providing a system in which a preamplifier detects and amplifies a low level signal from a piezoelectric sensor. The preamplifier is a single, monolithic integrated circuit that performs all of the interface functions for a sensor which has an internal capacitive impedance. The preamplifier provides signal amplification with its full-differential amplifier that includes common-mode feedback. The preamplifier is suitable for incorporation on the same monolithic integrated circuit with follow-on circuitry such as an analog-to-digital converter in order to achieve a complete sensor signal-to-digital data interface function. Low noise is achieved by two features of this preamplifier implementation. Firstly, the differential structure of this preamplifier causes silicon substrate noise to appear as a common-mode signal which can easily be removed by a differential to single-ended converter with good common-mode rejection ratio. Secondly, the small size of this preamplifier allows it to be placed close to the sensor without adversely affecting the sensor's performance, and thus improves signal-to-noise ratio as it is related to cable capacitance.

BRIEF DESCRIPTION OF THE DRAWINGS

The present invention may be better understood and its numerous objects and advantages will become apparent to those skilled in the art by reference to the accompanying drawings, wherein like reference numerals refer to like elements in the several figures, in which.

DESCRIPTION OF THE PREFERRED EMBODIMENT

Figure 1:
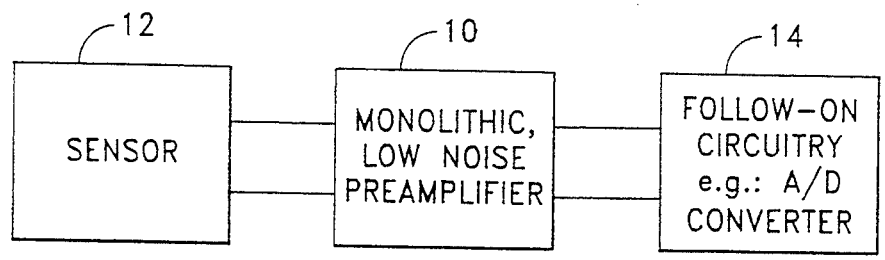
FIG. 1 is a block diagram including the components utilized in the present invention.

Refer now to FIG. 1 wherein there is shown a block diagram of a system that utilizes a preamplifier 10 in accordance with the present invention. The preamplifier 10 is designed to be suitable to being made into a single, monolithic integrated circuit. The input to the preamplifier 10 is a signal generated by the sensor 12. The output of the preamplifier 10 is a voltage which represents an amplified version of the sensor 12 signal. The preamplifier output is capable of driving the follow-on circuitry such as the analog-to-digital converter 14.

Figure 2:
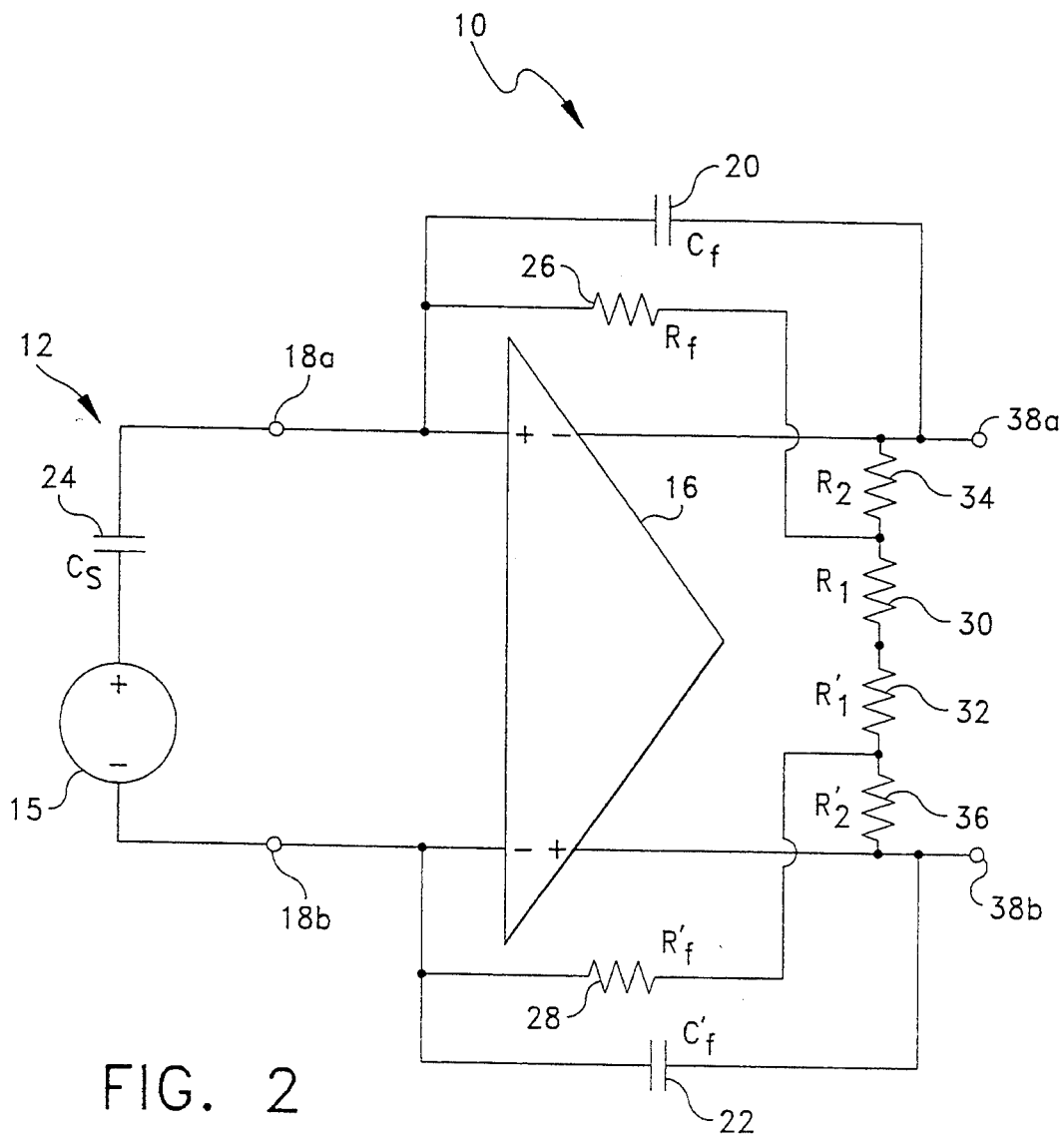
FIG. 2 is a circuit diagram of the preamplifier and sensor of FIG. 1.

FIG. 2 shows a circuit diagram of the preamplifier 10 and the sensor 12. The operational circuit configuration of the sensor 12 is schematically represented as the equivalent of a voltage source 15 in series with a capacitor 24. Signal amplification is performed by a full-differential amplifier which includes common-mode feedback. This full-differential amplifier 16 provides high gain to the sensor signal that appears at its inputs 18a and 18b. Feedback elements are used to provide control of the preamplifier gain as a function of frequency. Capacitors 20 (Cf) and 22 (Cf') together with sensor capacitance 24 (Cs) control the voltage gain of the preamplifier 10 over much of its useful operating bandwidth. The values of components can be chosen so that the circuit gain is constant over a wide frequency range (approximately 100 Hz to 100kHz). In this flat region differential gain is $4*Cs/(Cf+Cf')$ and because of its unique design and the arrangement of components, the gain is independent of cable and stray capacitance between the sensor and the preamplifier. The circuit gain may be made adjustable by implementing capacitors 20 (Cf) and 22 (Cf') as a group of parallel capacitive elements, each with a series switch. Each of the capacitive elements would have one side connected to a common point which is also shown as a first side of 20 (Cf) and 22 (Cf'). The other side of each capacitive element would be connected to a series switch. The other side of each of the switches would be connected together to a common point which is also shown as a second side of 20 (Cf) and 22 (Cf'). By various conventional means of control of the series switches, the overall gain of the circuit can be controlled.

Resistors 26 (Rf), 28 (Rf'), 30 (R1), 32 (R1'), 34 (R2), and 36 (R2') perform two functions. First, these resistive elements serve to discharge any accumulated DC voltage which might appear on the capacitors 20, 22, and 24 and which otherwise would cause the preamplifier outputs 38a and 38b to go off-scale. Second, these resistors form a high-pass filter which is useful to reject low frequency background noise from the sensor. The 3 dB corner frequency of this high pass filter is set by adjusting the resistors and is equal to $1/(2*\pi*Cf*Rf*(1+R2/R1))$. Previous preamplifier implementations required an off-chip capacitor in order to realize this high pass filter while simultaneously achieving low noise. This is because of the limited total capacitance available on a monolithic integrated circuit. The preamplifier 10 achieves the required low frequency filter pole without the need for a relatively large capacitor by using the feedback configuration of resistors and capacitors shown. The value of the 3dB corner frequency can be adjusted by implementing resistors 30 and 32 and/or resistors 34 and 36 as adjustable resistors. The configuration of resistors has resistors 34, 30, 32, and 35 serially connected between outputs 38a and 38b. Resistor 26 is connected between the positive input of differential amplifier 16 and the node between resistors 34 and 30. Resistor 28 is connected between the negative input of differential amplifier 16 and the node between resistors 32 and 36.

In the operating device, resistors 26, 28, 30, 32, 34, and 36 are implemented using MOSFET's (Metal Oxide Semiconductor Field Effect Transistors) biased in the triode (linear) region of operation. These resistors are implemented on the same monolithic integrated circuit as full-differential amplifier and the capacitors 20 (Cf) and 22 (Cf'). The implementation of MOSFET's as resistors is more completely described in an article by Banu and Tsividis, entitled "Fully Integrated Active RC Filters in MOS Technology" appearing in the *IEEE Journal of Solid State Circuits*, vol. SC-18, No. 6, Dec. 1983, pages 644–651 and in a text *Analog MOS Integrated Circuits for Signal Processing*, by Georgorian and Temes, Published by Wiley in 1986, and particularly Section 5.9 entitled "Integrated Active-RC Filters Using MOSFET Resistors" appearing at pages 387–404. Both of the above references are hereby incorporated herein by reference. A patent application Preamplifier with Adjustable Input Resistance, filed on Jun. 1, 1992 as U.S. application Ser. No. 07/891,119 by Patricia M. Eno and the present inventor show an additional application of MOSFET's as resistors.

Figure 3:
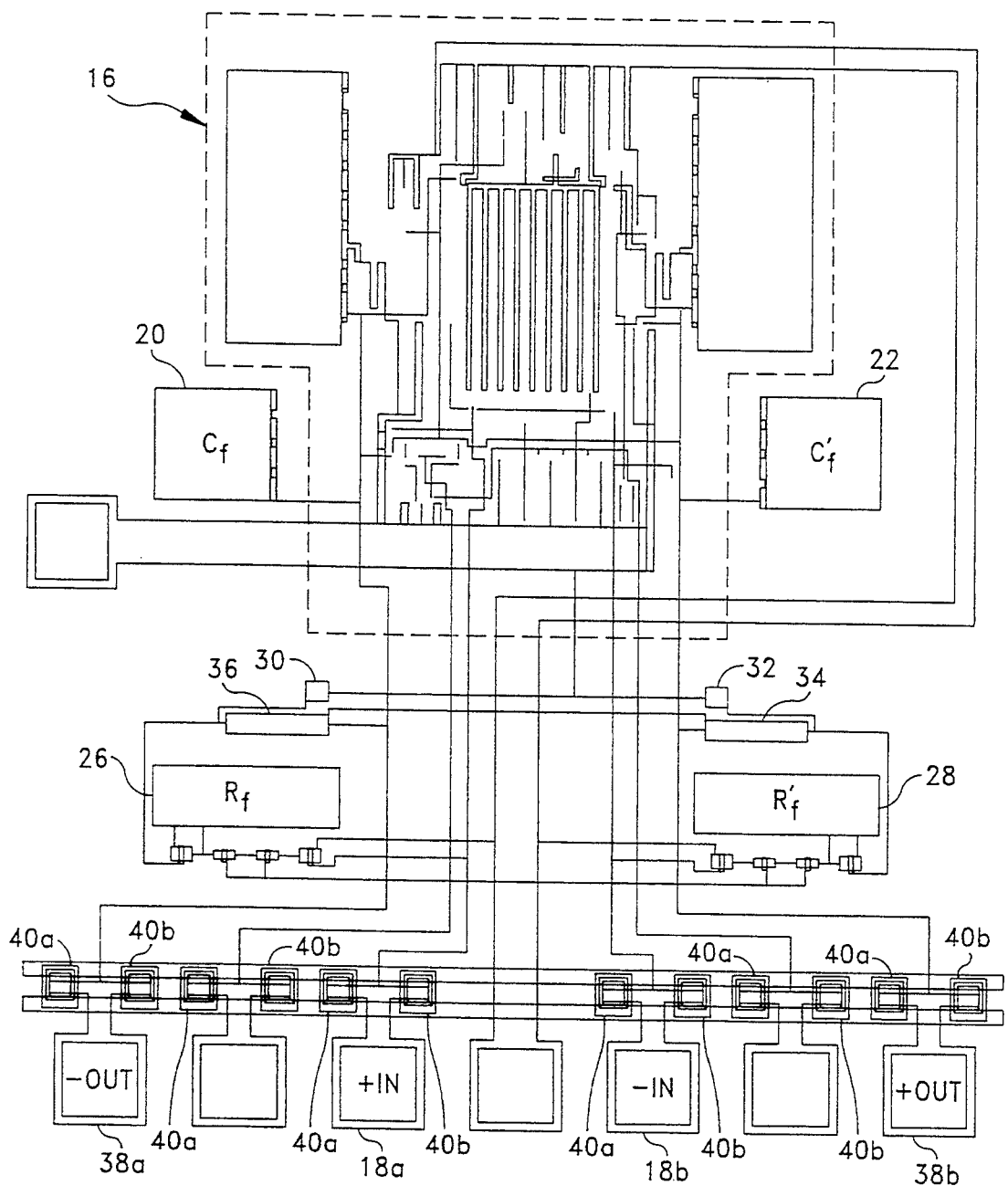
FIG. 3 is a layout of the preamplifier of FIGS. 1 and 2.

FIG. 3 is a layout of the preamplifier 10. All components shown in FIG. 2 appear in FIG. 3. Additionally, FIG. 3 shows protective diodes 40a, and 40b. The active circuitry of the preamplifier 10 occupies approximately $1 \times 1$ millimeter.

Figure 4:
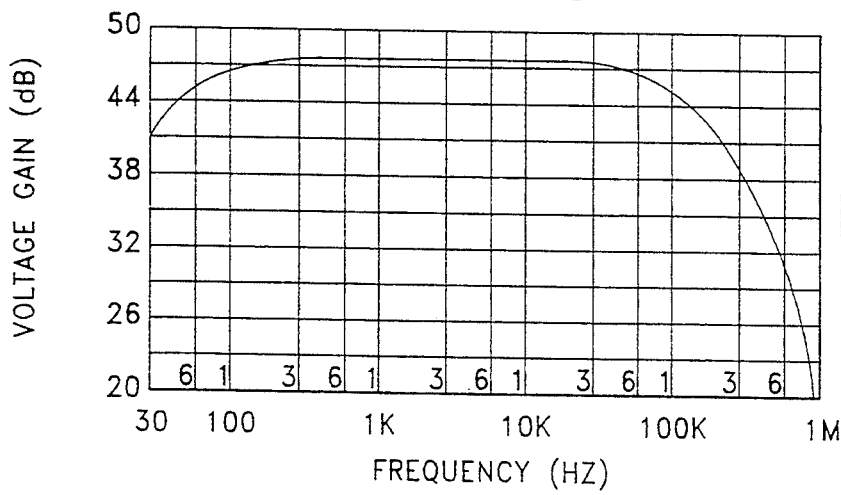
FIG. 4 is a graph depicting gain versus frequency characteristics of an operational embodiment of the present invention.

FIG. 4 depicts the highly satisfactory gain versus frequency characteristics measured in connection with an operational embodiment of preamplifier 10. The voltage gain of the device was measured from 30 Hertz to 1 megahertz using a 150 picofarad capacitance to simulate the impedance of a piezoelectric sensor. In FIG. 4, the vertical scale is a voltage gain in decibels and the horizontal scale is frequency in Hertz. The 3 dB bandwidth of this configuration covers the span from 60 Hz to greater than 100 kHz with a mid-band gain of 47.6dB.

There has therefore been described a monolithic preamplifier 10 as used in conjunction with a piezoelectric sensor 12 and a follow-on device such as an analog-to-digital converter 14. The preamplifier 10 is specifically designed to have lower noise than those in the prior art when used with a sensor having a small capacitance. The full differential architecture allows incorporation of the monolithic preamplifier 10 on the same chip with the analog-to-digital converter 14.

It will be understood that various changes in the details, materials, steps and arrangement of parts, which have been herein described and illustrated in order to explain the nature of the invention, may be made by those skilled in the art within the principle and scope of the invention as expressed in the appended claims.

What is claimed is:

1. A low noise preamplifier for piezoelectric sensors comprising:

a full differential amplifier with common mode feedback;

a pair of feedback capacitors for use in conjunction with input capacitance in controlling preamplifier gain; and means for both discharging any accumulated DC voltage on circuit capacitors and for forming a high pass filter for rejecting low frequency background noise from the preamplifier input, said means includes a feedback configuration of resistors, said configuration of resistors comprises a plurality of first resistors serially connected between said full differential amplifier outputs, a second resistor connected between one of said full differential amplifier inputs and a first node between two of said plurality of first resistors, and a third resistor connected between the other of said full differential inputs and a second node between two of said plurality of first resistors.

2. A low noise preamplifier for piezoelectric sensors according to claim 1 wherein said preamplifier is a single, monolithic integrated circuit.

3. A low noise preamplifier for piezoelectric sensors according to claim 2 wherein each of said resistors comprise a plurality of metal oxide semiconductor field effect transistors suitable for biasing in the triode region of operation.

4. A sensor system comprising:
   a sensor having an operational circuit configuration comprised of a voltage source in series with a capacitor;
   a preamplifier comprising a full differential amplifier with common mode feedback having a pair of feedback capacitors for use in conjunction with input capacitance from said sensor in controlling preamplifier gain and said preamplifier further having means for both discharging any accumulated DC voltage on circuit capacitors and for forming a high pass filter for rejecting low frequency background noise from said sensor, said means includes a feedback configuration of resistors.

5. A sensor system according to claim 4 wherein said preamplifier is a single, monolithic integrated circuit.

6. A low noise preamplifier for piezoelectric sensors according to claim 5 wherein each of said resistors comprise a plurality of metal oxide semiconductor field effect transistors suitable for biasing in the triode region of operation.

* * * * *